United States Patent
Fukumoto et al.

(10) Patent No.: US 12,074,097 B2
(45) Date of Patent: Aug. 27, 2024

(54) POWER MODULE

(71) Applicant: Mitsubishi Electric Corporation, Tokyo (JP)

(72) Inventors: Akihisa Fukumoto, Tokyo (JP); Masaki Goto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/265,700

(22) PCT Filed: May 17, 2021

(86) PCT No.: PCT/JP2021/018672
§ 371 (c)(1),
(2) Date: Jun. 7, 2023

(87) PCT Pub. No.: WO2022/244080
PCT Pub. Date: Nov. 24, 2022

(65) Prior Publication Data
US 2023/0395470 A1    Dec. 7, 2023

(51) Int. Cl.
*H01L 23/495*    (2006.01)
*H01L 23/29*    (2006.01)

(52) U.S. Cl.
CPC ...... *H01L 23/49551* (2013.01); *H01L 23/293* (2013.01); *H01L 23/4952* (2013.01)

(58) Field of Classification Search
CPC ............. H01L 23/49551; H01L 23/293; H01L 23/4952; H01L 23/3737; H01L 23/49548; H01L 21/4842; H01L 23/3735; H01L 23/4334; H01L 23/49555; H01L 23/3107; H01L 23/48; H01L 23/49562; H01L 23/50

USPC ......................................................... 257/666
See application file for complete search history.

(56) References Cited

U.S. PATENT DOCUMENTS 10,943,891 B2    3/2021    Sano

FOREIGN PATENT DOCUMENTS

| JP | H04-150042 A | 5/1992 |
| JP | H05-326782 A | 12/1993 |
| JP | H07-142671 A | 6/1995 |
| JP | H09-232512 A | * 9/1997 |
| JP | H10-022435 A | 1/1998 |
| JP | 2006-041137 A | 2/2006 |

(Continued)

OTHER PUBLICATIONS

International Search Report and Written Opinion mailed on Jul. 20, 2021, received for PCT Application PCT/JP2021/018672, filed on May 17, 2021, 8 pages including English Translation.

(Continued)

*Primary Examiner* — Caleen O Sullivan
(74) *Attorney, Agent, or Firm* — XSENSUS LLP

(57) ABSTRACT

A power module includes: a resin mold; and a lead frame in which a first region is drawn out from a first surface of the resin mold, and a second region extending from the first region in a direction perpendicular to the first surface is sealed inside the resin mold. The first region is bent toward a second surface of the resin mold along the first surface, and the first surface has a shape in which a bending angle is larger than 90 degrees, in which the bending angle is an angle formed by two regions, in the lead frame, adjacent to each other with a bent portion formed by bending the first region interposed in between.

10 Claims, 14 Drawing Sheets

(56) References Cited

FOREIGN PATENT DOCUMENTS

| | | |
|---|---|---|
| JP | 2012-054319 A | 3/2012 |
| JP | 2012-069666 A | 4/2012 |
| JP | 2019-204924 A | 11/2019 |

OTHER PUBLICATIONS

Decision to Grant mailed on Jan. 18, 2022, received for JP Application 2021-556859, 5 pages including English Translation.
Chinese Office Action dated Nov. 25, 2023 from the Chinese patent office in application No. 202180088696.6, 11 pages.

* cited by examiner

POWER MODULE

CROSS-REFERENCE TO RELATED APPLICATION

The present application is based on PCT filing PCT/JP2021/018672, filed May 17, 2021, the entire contents of which are incorporated herein by reference.

FIELD

The present disclosure relates to a resin molded type power module.

BACKGROUND

Patent Literature 1 discloses a resin mold type semiconductor module including a lead frame drawn to an outside of the resin mold from a side surface of a resin mold and bent toward an upper surface along the side surface of the resin mold.

CITATION LIST

Patent Literature

Patent Literature 1: Japanese Patent Application Laid-open No. H10-22435

SUMMARY

Technical Problem

However, in the semiconductor module of Patent Literature 1, a portion of the lead frame drawn out from the side surface of the resin mold is bent at a drawn root portion at a bending angle of 90 degrees or less from a longitudinal direction of the lead frame sealed inside the resin mold. Therefore, in the semiconductor module of Patent Literature 1, there has been a problem that stress concentrates on resin around the root of the lead frame when the lead frame drawn out from the side surface of the resin mold is bent, and a crack occurs in resin around the root of the lead frame to damage the semiconductor module.

The present disclosure has been made in view of the above, and an object thereof is to provide a power module in which damage caused by bending of a lead frame drawn out from one surface of a resin mold is suppressed.

Solution to Problem

To solve the above problems and achieve the object, a power module according to the present disclosure includes: a resin mold; and a lead frame in which a first region is drawn out from a first surface of the resin mold, and a second region extending from the first region in a direction perpendicular to the first surface is sealed inside the resin mold. The first region is bent toward a second surface of the resin mold along the first surface, and the first surface has a shape in which a bending angle is larger than 90 degrees, the bending angle being an angle formed by two regions of the lead frame, the two regions being adjacent to each other with a bent portion formed by bending the first region interposed in between.

Advantageous Effects of Invention

The power module according to the present disclosure has an effect of suppressing damage caused by bending of the lead frame drawn out from one surface of the resin mold.

DESCRIPTION OF EMBODIMENTS

Figure 1:
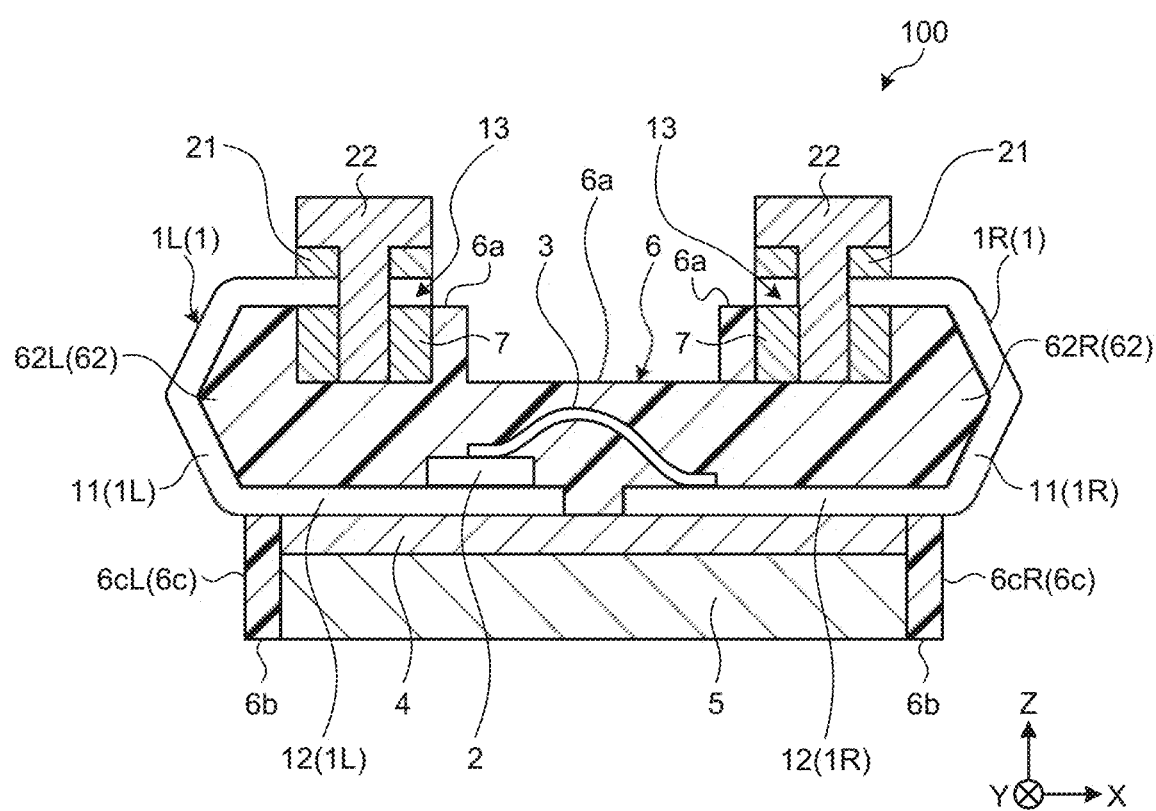
FIG. 1 is a cross-sectional view of a power module according to a first embodiment.

Hereinafter, a power module according to embodiments will be described in detail with reference to the drawings. In the drawings illustrated below, a scale of each member may be different from an actual scale for easy understanding. This similarly applies between the individual drawings.

First Embodiment

Figure 2:
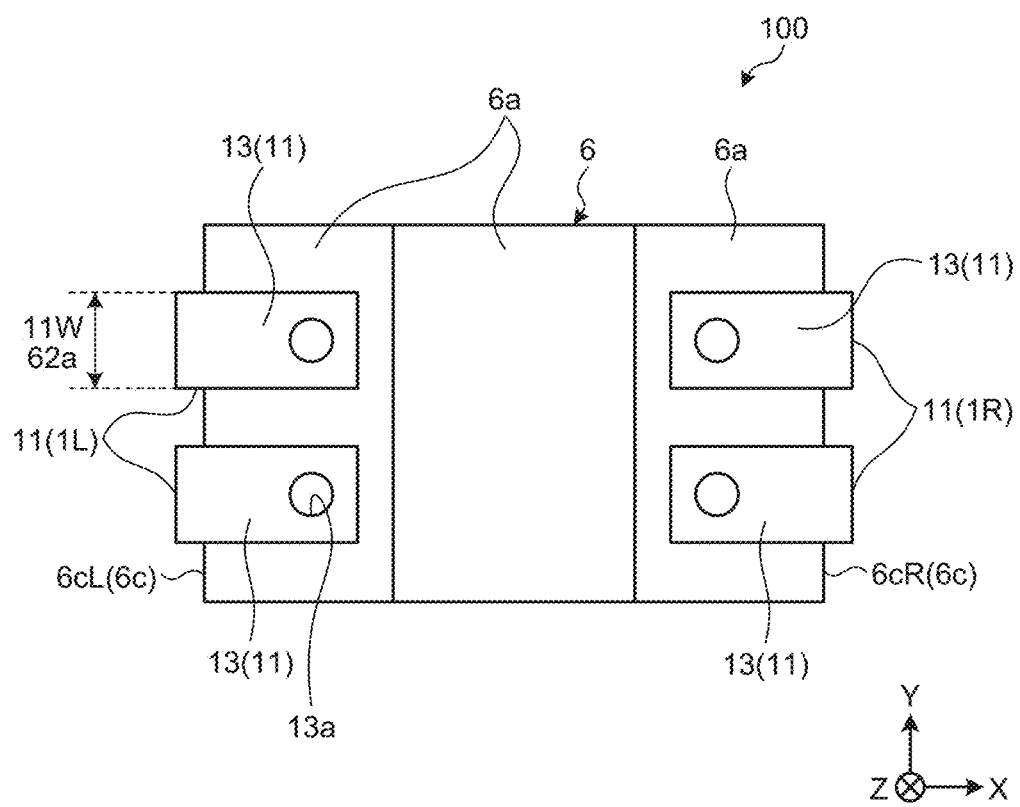
FIG. 2 is a top view of the power module according to the first embodiment.

FIG. 1 is a cross-sectional view of a power module 100 according to a first embodiment. FIG. 2 is a top view of the power module 100 according to the first embodiment. FIG.

3 is an enlarged view of a main part, illustrating a periphery of a protruding portion 62 in FIG. 1 in an enlarged manner. Note that FIG. 2 illustrates a state where a bolt 22 is removed. Note that, in the cross-sectional view, hatching is partially omitted to facilitate viewing.

Figure 3:
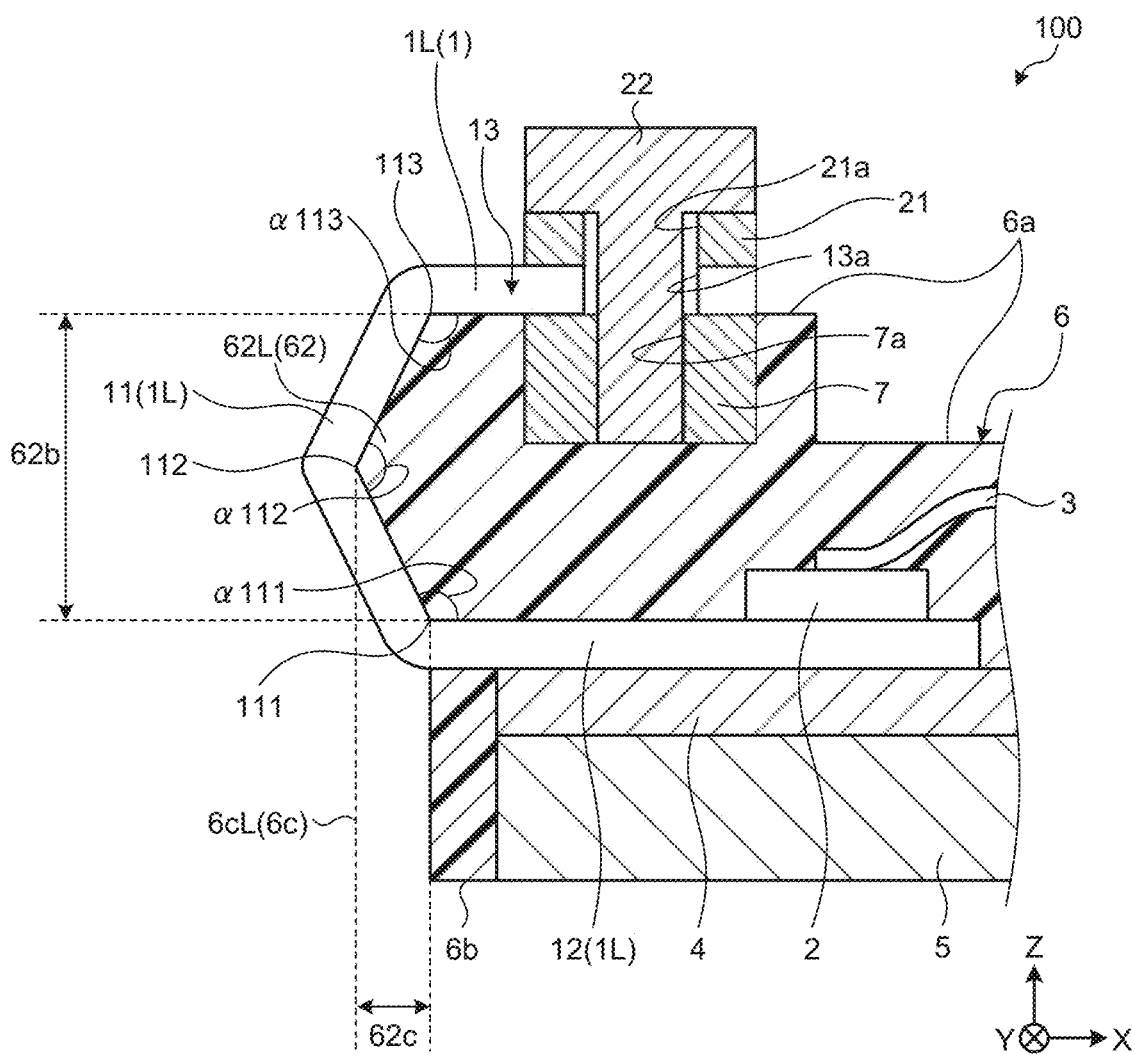
FIG. 3 is an enlarged view of a main part, illustrating a periphery of a protruding portion in FIG. 1 in an enlarged manner.

In the first embodiment, a horizontal direction in FIGS. 1 to 3 is defined as a horizontal direction. The horizontal direction corresponds to an X direction in FIGS. 1 to 3. Further, a depth direction of the page in FIGS. 1 and 3 and a vertical direction in FIG. 2 are defined as a depth direction. The depth direction corresponds to a Y direction in FIGS. 1 to 3. Further, a vertical direction in FIGS. 1 and 3 and a depth direction of the page in FIG. 2 are defined as a vertical direction. The vertical direction corresponds to a Z direction in FIGS. 1 to 3. Further, a front side in the depth direction of the page of FIG. 1 and a downward direction of FIG. 2 are defined as a front face side of the power module 100. A back side in the depth direction of the page of FIG. 1 and an upward direction of FIG. 2 are defined as a rear face side of the power module 100.

The power module 100 is a resin mold type power module. As illustrated in FIG. 1, the power module 100 includes a lead frame 1, a power element 2, metal wire wiring 3, and a resin mold 6.

The resin mold 6 is a resin housing constituting a housing of the power module 100. The resin mold 6 is formed by thermosetting resin such as epoxy, and secures insulating properties between members disposed inside. The resin mold 6 is, for example, a transfer mold formed by transfer molding. However, the method for molding the resin mold 6 is not limited to the transfer molding.

The resin mold 6 has a rectangular parallelepiped shape. An upper surface 6a of the resin mold 6 and a lower surface 6b of the resin mold 6 are parallel to each other. Further, a left side surface 6cL which is a side surface 6c of the resin mold 6 on a left side and a right side surface 6cR which is a side surface 6c of the resin mold 6 on a right side are parallel to each other. An angle formed by the left side surface 6cL and the upper surface 6a and the lower surface 6b is 90 degrees. That is, the upper surface 6a and the lower surface 6b are orthogonal to the left side surface 6cL. An angle formed by the right side surface 6cR and the upper surface 6a and the lower surface 6b is 90 degrees. That is, the upper surface 6a and the lower surface 6b are orthogonal to the right side surface 6cR. Note that the upper surface 6a of the resin mold 6 can be said to be an upper surface of the power module 100.

Here, the left side surface 6cL and the right side surface 6cR, which are the side surfaces 6c of the resin mold 6: are a first surface of the resin mold 6; and are surfaces on which the lead frame 1 is drawn to an outside of the resin mold 6 from an inside of the resin mold 6, in an outer shape of the resin mold 6, that is, in a rectangular parallelepiped shape of the resin mold 6. The upper surface 6a of the resin mold 6: is a second surface of the resin mold 6; and is a surface orthogonal to the left side surface 6cL and the right side surface 6cR; and positioned in a direction in which the lead frame 1 drawn to the outside of the resin mold 6 is bent, in the outer shape of the resin mold 6, that is, in the rectangular parallelepiped shape of the resin mold 6. In other words, the upper surface 6a of the resin mold 6 can be said to be a surface orthogonal to the left side surface 6cL and the right side surface 6cR and positioned on the protruding portion 62 side from the lead frame 1 drawn to the outside of the resin mold 6, in the outer shape of the resin mold 6, that is, in the rectangular parallelepiped shape of the resin mold 6. The lower surface 6b of the resin mold 6 is a surface opposed to the upper surface 6a of the resin mold 6 in the outer shape of the resin mold 6, that is, in the rectangular parallelepiped shape of the resin mold 6.

In a surface layer of the upper surface 6a of the resin mold 6, a nut 7 to screw a terminal 13 described later of the lead frame 1 to the upper surface 6a of the resin mold 6 is disposed in a state where a screw hole 7a is exposed to the upper surface 6a. The nut 7 is used to fasten the terminal 13 of a first lead frame 11 described later and an external bus bar 21 together with one bolt 22. The bus bar 21 is a wiring component to be connected to an external wiring, and is a metal plate.

Further, the resin mold 6 includes an insulating sheet 4 and a metal base 5. In the resin mold 6, the power element 2 and a part of the lead frame 1 are disposed inside, and the insulating sheet 4 and the metal base 5 are disposed in this order on the lower surface 6b side. That is, the metal base 5 is exposed on the lower surface 6b. By exposing the metal base 5, a surface area of resin having hygroscopicity can be reduced, and electrical defects such as ion migration due to hygroscopicity can be suppressed.

The insulating sheet 4 is an insulating layer having a heat dissipation property equivalent to that of the thermosetting resin constituting the resin mold 6 or a heat dissipation property higher than that of the thermosetting resin constituting the resin mold 6. The insulating sheet 4 insulates between the metal base 5 and a second lead frame 12 to be described later, which is the lead frame 1 inside the resin mold 6, and dissipates heat generated by the power element 2 to the metal base 5. Thermosetting resin such as epoxy is used for the insulating sheet 4, and a highly conductive filler such as silica or boron nitride is mixed inside. The metal base 5 dissipates heat transmitted from the power element 2. The metal base 5 is made by a material having a relatively high thermal conductivity, such as a copper plate, an aluminum plate, and a copper foil, among metals.

Note that, in the first embodiment, although a configuration has been described in which the resin mold 6 includes the insulating sheet 4 and the metal base 5, but the resin mold 6 may be made by only a resin material.

The side surface 6c of the resin mold 6 is provided with the protruding portion 62 projecting and protruding from the side surface 6c in the horizontal direction, that is, the protruding portion 62 projecting and protruding laterally from the side surface 6c. That is, the side surface of the power module 100 is provided with the protruding portion projecting and protruding outward from the side surface of the power module 100. On the side surface 6c of the resin mold 6, the protruding portion 62 is provided between the upper surface 6a of the resin mold 6 and a position of a root of the lead frame 1 drawn to the outside of the resin mold 6 on the upper surface 6a side of the resin mold 6. Note that the root of the lead frame 1 is a boundary between the first lead frame 11 to be described later and the second lead frame 12 to be described later. That is, in the vertical direction, the protruding portion 62 is provided between a position of an upper end of the side surface 6c of the resin mold 6 and the position of the root of the lead frame 1 drawn to the outside of the resin mold 6 on the upper surface 6a side of the resin mold 6.

The protruding portion 62 is formed such that a bending angle α of the lead frame 1 drawn to the outside of the resin mold 6 from the side surface 6c of the resin mold 6 is larger than 90 degrees. The bending angle α is an angle formed by the lead frame 1 and the lead frame 1 adjacent to each other in a longitudinal direction of the lead frame 1, with a bent portion of the lead frame 1 interposed in between. More specifically, the bending angle α can be said to be an angle formed by two regions, in the lead frame 1, adjacent to each other in the longitudinal direction of the lead frame 1 with a bent portion in which the first lead frame 11 described later is bent interposed in between.

A left protruding portion 62L is provided on the left side surface 6cL of the resin mold 6. A right protruding portion 62R is provided on the right side surface 6cR of the resin mold 6. The left protruding portion 62L is a protruding portion having a triangular shape protruding leftward from the left side surface 6cL of the resin mold 6 in front view. An interior angle of a left apex of the triangular shape of the left protruding portion 62L is made larger than 90 degrees. The right protruding portion 62R is a protruding portion having a triangular shape protruding rightward from the right side surface 6cR of the resin mold 6 in front view. An interior angle of a right apex of the triangular shape of the right protruding portion 62R is made larger than 90 degrees.

In front view, on the side surface 6c of the resin mold 6, a position of a lower apex of the triangular shape of the protruding portion 62 corresponds to a position of the root of the lead frame 1 drawn out from the side surface 6c of the resin mold 6 on the upper surface 6a side of the resin mold 6. In front view, a position of an upper apex of the triangular shape of the protruding portion 62 corresponds to an upper end of the side surface 6c of the resin mold 6, that is, a corner of the upper surface 6a of the resin mold 6. Therefore, the protruding portion 62 is formed in the vertical direction from the position of the root of the lead frame 1 drawn out from the side surface 6c of the resin mold 6 on the upper surface 6a side of the resin mold 6 to the position of the upper end of the side surface 6c of the resin mold 6. The upper end of the side surface 6c of the resin mold 6 is an end of the side surface 6c of the resin mold 6 on the upper surface 6a side of the resin mold 6.

The protruding portion 62 is constituted by resin identical to the resin mold 6. The protruding portion 62 is formed by transfer molding when the resin mold 6 is molded. Note that the protruding portion 62 may be formed as a separate component different from a main body of the resin mold 6 formed by transfer molding, and attached to the side surface 6c of the resin mold 6. Examples of a method for attaching the protruding portion 62 formed as the separate component to the side surface 6c of the main body of the resin mold 6 include a method using an adhesive tape, an adhesive, and the like, but the connection method is not particularly limited as long as a connection state between the side surface 6c of the main body of the resin mold 6 and the protruding portion 62 can withstand a use environment of the power module 100.

The lead frame 1 electrically connects the power element 2 to the external bus bar 21. The lead frame 1 is formed in pattern by press molding of a metal plate. Examples of a material of the lead frame 1 include, for example, copper and a copper alloy. Copper and a copper alloy are materials having a relatively high elastic modulus among metals. The lead frame 1 has a uniform width over the entire length.

The lead frame 1 includes: the first lead frame 11 which is a lead-out portion drawn to the outside of the resin mold 6 from the side surface 6c of the resin mold 6; and the second lead frame 12 which is a sealed portion extending from the first lead frame 11 and sealed inside the resin mold 6. The first lead frame 11 is a first region in the lead frame 1. The second lead frame 12 is a second region in the lead frame 1. Further, in the power module 100, a left lead frame 1L disposed on the left side and the right lead frame 1R disposed on a right side are provided as the lead frame 1.

The lead frame 1 is electrically connected to an electrode of the power element 2. That is, the power element 2 is mounted on the second lead frame 12 of the left lead frame 1L. In the power element 2, a back electrode (not illustrated) of the power element 2 is connected to the second lead frame 12 of the left lead frame 1L by an adhesive member such as solder. Further, a surface electrode (not illustrated) of the power element 2 is connected to the second lead frame 12 of the right lead frame 1R by the metal wire wiring 3.

A longitudinal direction of the second lead frame 12 sealed inside the resin mold 6 is a direction parallel to the horizontal direction. That is, the longitudinal direction of the second lead frame 12 sealed inside the resin mold 6 is a direction parallel to the upper surface 6a of the resin mold 6 and the lower surface 6b of the resin mold 6, and is a direction orthogonal to the depth direction of the resin mold 6. Further, since the upper surface 6a of the resin mold 6 and the lower surface 6b of the resin mold 6 are orthogonal to the left side surface 6cL and the right side surface 6cR, the longitudinal direction of the second lead frame 12 is orthogonal to the side surface 6c of the resin mold 6. That is, the second lead frame 12 sealed inside the resin mold 6 extends from the first lead frame 11 in a direction perpendicular to the side surface 6c of the resin mold 6 which is the first surface. The upper surface 6a of the resin mold 6, the lower surface 6b of the resin mold 6, an in-plane direction of the insulating sheet 4, and an in-plane direction of the metal base 5 are parallel to one another. Therefore, the longitudinal direction of the second lead frame 12 sealed inside the resin mold 6 is a direction parallel to the in-plane direction of the insulating sheet 4 and the in-plane direction of the metal base 5.

The first lead frame 11 is drawn laterally from the side surface 6c of the resin mold 6 which is a side surface of the power module 100, bent from the side surface of the power module 100 along the protruding portion 62, and extended to the upper surface 6a of the resin mold 6 which is the upper surface of the power module 100.

In the first lead frame 11, a distal end portion, that is, a portion placed on the upper surface 6a of the resin mold 6 serves as the terminal 13. The terminal 13 functions as a screw terminal for electrical and mechanical connection with the bus bar 21. As illustrated in FIG. 2, a screw hole 13a is formed in the terminal 13. The screw hole 13a is a screw hole to be used to fasten the terminal 13 of the first lead frame 11 and the external bus bar 21 together with one bolt 22. In the terminal 13, in a state where the terminal 13 and the bus bar 21 are arranged on the nut 7 in this order, the bolt 22 passes through the screw hole 7a and the screw hole 13a from above, and fastened together with the bolt 22 to be fixed to the upper surface 6a of the resin mold 6.

Figure 4:
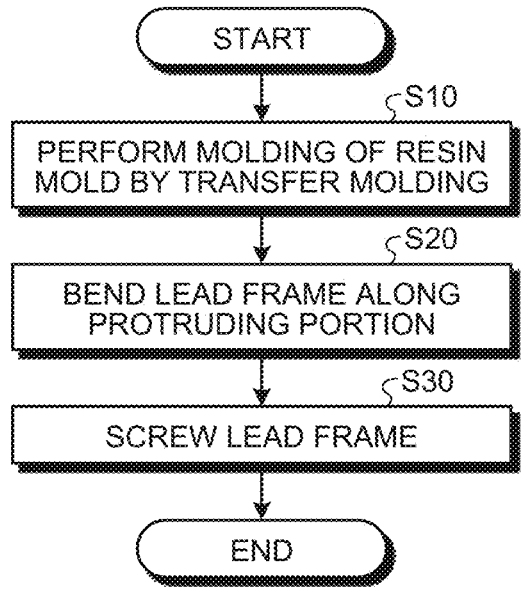
FIG. 4 is a flowchart illustrating a procedure of a method of manufacturing the power module illustrated in FIG. 1.
Figure 5:
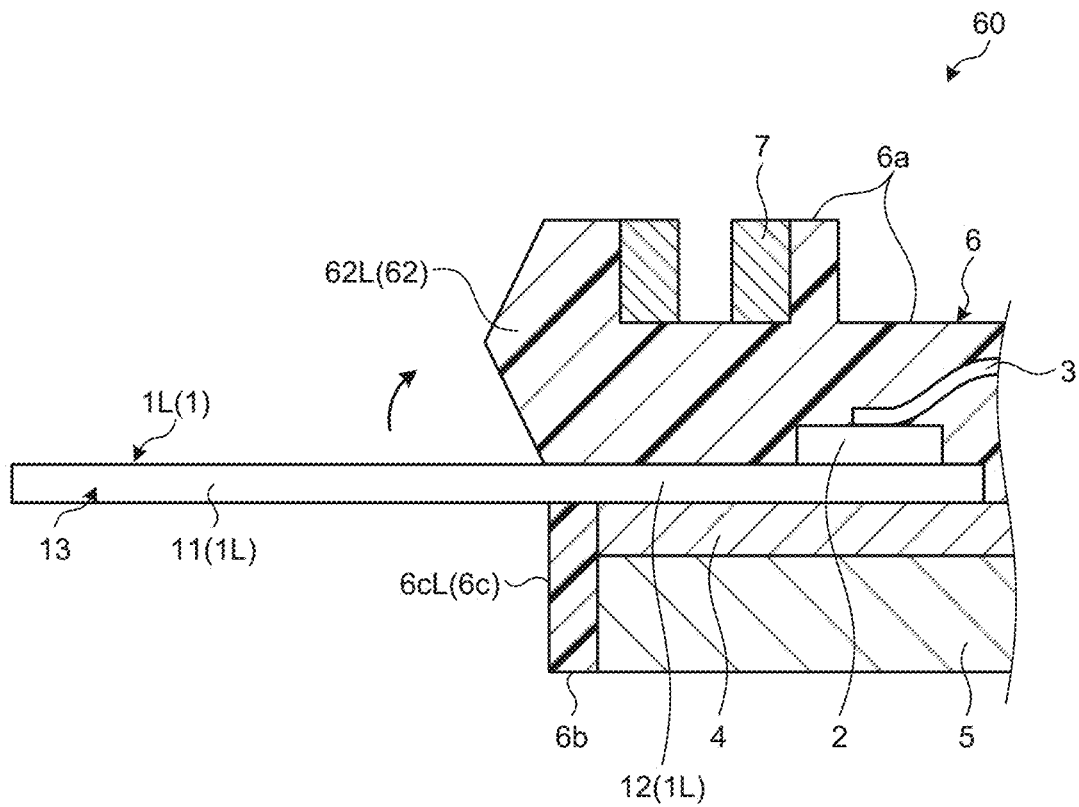
FIG. 5 is a first view illustrating the method of manufacturing the power module illustrated in FIG. 1.
Figure 6:
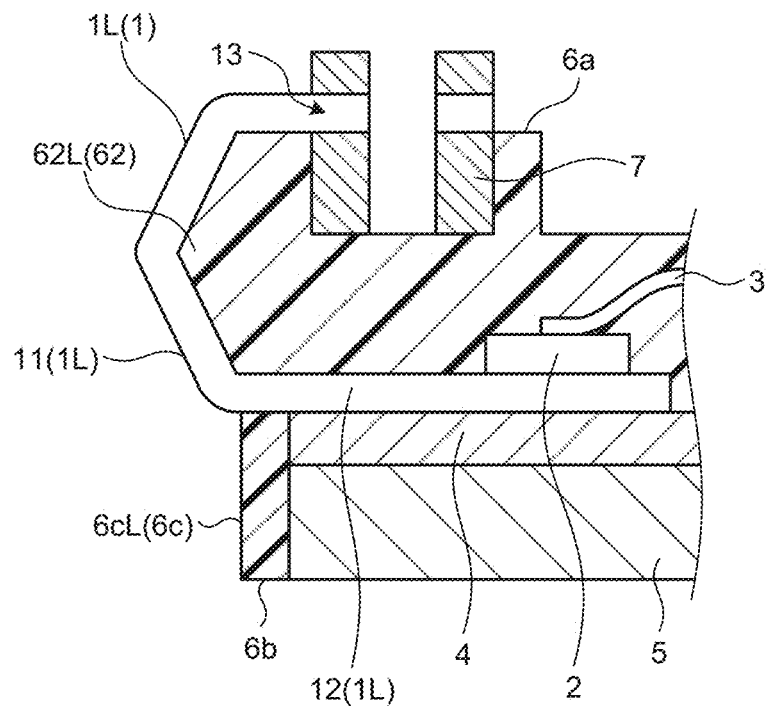
FIG. 6 is a second view illustrating the method of manufacturing the power module illustrated in FIG. 1.
Figure 7:
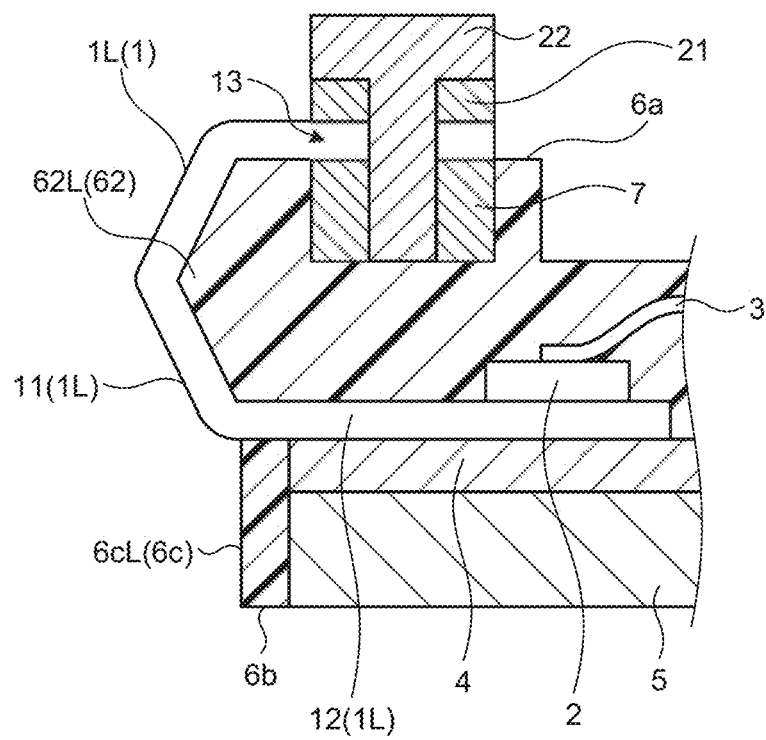
FIG. 7 is a third view illustrating the method of manufacturing the power module illustrated in FIG. 1.

Next, a method of manufacturing the power module 100 will be described. FIG. 4 is a flowchart illustrating a procedure of a method of manufacturing the power module 100 illustrated in FIG. 1. FIG. 5 is a first view illustrating the method of manufacturing the power module 100 illustrated in FIG. 1. FIG. 6 is a second view illustrating the method of manufacturing the power module 100 illustrated in FIG. 1. FIG. 7 is a third view illustrating the method of manufacturing the power module 100 illustrated in FIG. 1. Note that, in FIGS. 5 to 7, a portion corresponding to a left half of the power module 100 is illustrated. Note that, hereinafter, a description will be given up to a process of fastening the first lead frame 11 of the lead frame 1 of the power module 100 together with the bus bar 21 external to the power module 100.

In step S10, a resin molding process of molding a resin mold by transfer molding is performed. Since transfer molding is a general method, a detailed description thereof will be omitted. Note that the lead frame 1 is disposed such that the longitudinal direction of the lead frame 1 is the horizontal direction in FIG. 1.

A resin mold 60 as illustrated in FIG. 5 is formed by transfer molding. In the resin mold 60 illustrated in FIG. 5, the first lead frame 11 of the lead frame 1 remains drawn to the outside from the side surface 6c of the resin mold 60 outward toward a direction perpendicular to the side surface 6c, and is not bent yet. A longitudinal direction of the first lead frame 11 and a longitudinal direction of the second lead frame 12 in the resin mold 60 in this state are both parallel to the horizontal direction. Note that the nut 7 may be provided in the resin mold 60 in transfer molding, or may be provided by being fitted into a hole formed in the resin of the resin mold 60 after transfer molding.

Next, in step S20, a lead frame bending process of bending the lead frame 1 along the protruding portion 62 is performed. Specifically, in the resin mold 60, the first lead frame 11 of the lead frame 1 in a state of being drawn to an outside from the side surface 6c of the resin mold 60 is bent upward along the protruding portion 62. That is, the first lead frame 11 is bent upward along the side surface 6c from which the first lead frame 11 is drawn out.

Then, as illustrated in FIG. 6, a distal end portion of the first lead frame 11 is bent at a corner of the upper surface 6a of the resin mold 60, that is, at an upper end of the protruding portion 62 in front view, and placed on the upper surface 6a of the resin mold 60. At this time, the distal end portion of the first lead frame 11 is positioned such that the screw hole 13a of the terminal 13 of the first lead frame 11 overlaps with the screw hole 7a of the nut 7 on the upper surface 6a of the resin mold 60.

Next, in step S30, a screwing process of screwing the lead frame 1 is performed. Specifically, the bus bar 21 is disposed on the terminal 13 at the distal end portion of the first lead frame 11. Then, the bolt 22 is passed through a screw hole 21a of the bus bar 21, the screw hole 13a of the terminal 13, and the screw hole 7a of the nut 7 from above, and the terminal 13 and the bus bar 21 are fastened together by the bolt 22, which allows the terminal 13 and the bus bar 21 to be fixed to the upper surface 6a of the resin mold 60. As a result, as illustrated in FIG. 7, the power module 100 is obtained in which the first lead frame 11 is fastened together with the external bus bar 21.

Next, effects of the protruding portion 62 will be described. As described above, the power module 100 is provided with the protruding portion 62 projecting and protruding laterally from the side surface 6c of the resin mold 6. Then, the first lead frame 11 drawn to the outside of the resin mold 6 toward a direction perpendicular to the side surface 6c from the inside of the resin mold 6 is bent toward the upper surface 6a side along the protruding portion 62. Further, the distal end portion of the first lead frame 11 is bent at a corner of the upper surface 6a of the resin mold 6, that is, at an upper end of the protruding portion 62 in front view, and disposed on the upper surface 6a of the resin mold 6.

Accordingly, in the power module 100, the bending angle α is larger than 90 degrees when the first lead frame 11 drawn to the outside of the resin mold 6 from the inside of the resin mold 6 toward the direction perpendicular to the side surface 6c is bent toward the upper surface 6a side of the resin mold 6 along the side surface 6c.

The bending angle α is an angle formed by the lead frame 1 and the lead frame 1 adjacent to each other in the longitudinal direction of the lead frame 1, with a bent portion of the lead frame 1 interposed in between.

As illustrated in FIG. 3, the first lead frame 11 drawn to the outside of the resin mold 6 from the inside of the resin mold 6 on the side surface 6c of the resin mold 6 is bent at a bent portion 111 of the root portion of the first lead frame 11. Since the protruding portion 62 is provided on the side surface 6c of the resin mold 6, a bending angle α111 of the first lead frame 11 at the bent portion 111 is larger than 90 degrees.

The first lead frame 11 drawn to the outside of the resin mold 6 from the side surface 6c of the resin mold 6 is bent from the state illustrated in FIG. 5 to the state illustrated in FIG. 6 as described above. When the first lead frame 11 extending in the horizontal direction from the side surface 6c of the resin mold 6 is bent upward, in the resin mold 6, stress concentrates on resin in a portion in contact with the bent portion 111 of the first lead frame 11 and resin around the portion in contact with the bent portion 111. That is, since the first lead frame 11 is bent upward at the bent portion 111, stress concentrates on the resin located around the root portion of the first lead frame 11 in the resin mold 6.

Then, when stress concentrates on the resin located around the root portion of the first lead frame 11, there is a possibility that a crack occurs in the resin at the portion. That is, when the first lead frame 11 is bent upward at the bent portion 111, stress may concentrate on a corner of the resin corresponding to the bent portion 111 to cause a crack in the resin at the portion.

However, in the power module 100, since the first lead frame 11 is bent upward along the protruding portion 62, the bending angle α111 of the first lead frame 11 at the bent portion 111 is made larger than 90 degrees. That is, in the power module 100, an angle at which the first lead frame 11 is bent at the bent portion 111 is made larger than 90 degrees. Therefore, the first lead frame 11 is not bent at the bending angle α of 90 degrees or less at the bent portion 111.

Therefore, in the power module 100, force required for bending the first lead frame 11 upward at the bent portion 111 can be reduced as compared with a case where the first lead frame 11 is bent at the bending angle α of 90 degrees or less. Accordingly, in the power module 100, stress applied to a corner of the resin corresponding to the bent portion 111 when the first lead frame 11 is bent upward at the bent portion 111 can be reduced as compared with a case where the first lead frame 11 is bent at the bending angle α of 90 degrees or less, and it is possible to suppress an occurrence of cracks in the resin at the portion.

The effect described above is particularly effective when the lead frame 1 having high mechanical strength is used, such as copper and a copper alloy, in which an elastic modulus is high among metals and stress for deformation is relatively large among metals. Further, the effect described above is particularly effective when a thickness is large even in the lead frame 1 made of the same material.

Further, the first lead frame 11 is bent at a bent portion 112 corresponding to an apex of a position projecting laterally from the side surface 6c of the resin mold 6 in the triangular shape of the protruding portion 62. An interior angle of a left apex of the triangular shape in the protruding portion 62 is made larger than 90 degrees. That is, as illustrated in FIG. 3, the first lead frame 11 is bent at the bent portion 112 corresponding to the position of the left apex of the triangular shape in the left protruding portion 62L. An interior angle of an apex of the triangular shape in the left protruding portion 62L is made larger than 90 degrees. As a result, a bending angle $\alpha 112$ of the first lead frame 11 at the bent portion 112 is larger than 90 degrees.

In the power module 100, since the first lead frame 11 is bent along the protruding portion 62, the bending angle $\alpha 112$ of the first lead frame 11 at the bent portion 112 is made larger than 90 degrees. That is, in the power module 100, an angle at which the first lead frame 11 is bent at the bent portion 112 is made larger than 90 degrees.

Therefore, in the power module 100, force required for bending the first lead frame 11 at the bent portion 112 can be reduced as compared with a case where the first lead frame 11 is bent at the bending angle $\alpha$ of 90 degrees or less. Accordingly, in the power module 100, stress applied to a corner of the resin corresponding to the bent portion 112 when the first lead frame 11 is bent at the bent portion 112 can be reduced as compared with a case where the first lead frame 11 is bent at the bending angle $\alpha$ of 90 degrees or less, and it is possible to suppress an occurrence of cracks in the resin at the portion.

Further, the first lead frame 11 is bent at a bent portion 113 corresponding to a position of a corner of the upper surface 6a of the resin mold 6. An angle of the corner of the upper surface 6a of the resin mold 6 is made larger than 90 degrees. That is, as illustrated in FIG. 3, the first lead frame 11 is bent at the bent portion 113 corresponding to the position of the corner of the upper surface 6a of the resin mold 6. In front view, an angle formed by the upper surface 6a of the resin mold 6 and the left protruding portion 62L is made larger than 90 degrees. As a result, a bending angle $\alpha 113$ of the first lead frame 11 at the bent portion 113 is larger than 90 degrees.

In the power module 100, the distal end portion of the first lead frame 11 is bent from the protruding portion 62 along the corner of the upper surface 6a, so that the bending angle $\alpha 113$ of the first lead frame 11 at the bent portion 113 is made larger than 90 degrees. That is, in the power module 100, an angle at which the first lead frame 11 is bent at the bent portion 113 is made larger than 90 degrees.

Therefore, in the power module 100, force required for bending the first lead frame 11 at the bent portion 113 can be reduced as compared with a case where the first lead frame 11 is bent at the bending angle $\alpha$ of 90 degrees or less. Accordingly, in the power module 100, stress applied to a corner of the resin corresponding to the bent portion 113 when the first lead frame 11 is bent at the bent portion 113 can be reduced as compared with a case where the first lead frame 11 is bent at the bending angle $\alpha$ of 90 degrees or less, and it is possible to suppress an occurrence of cracks in the resin at the portion.

Note that a protrusion length 62a of the protruding portion 62 preferably has a dimension equal to or longer than a width 11W of the first lead frame 11. In the first embodiment, the protrusion length 62a of the protruding portion 62 has a dimension equal to a dimension of the width 11W of the first lead frame 11. However, the protrusion length 62a of the protruding portion 62 may be shorter than the width 11W of the first lead frame 11 within a range in which the effect obtained by providing the protruding portion 62 described above can be obtained. The protrusion length 62a of the protruding portion 62 is a length of the protruding portion 62 in the depth direction. The width 11W of the first lead frame 11 is a length of the first lead frame 11 in a short direction, that is, a length of the first lead frame 11 in the depth direction.

Further, it suffices that a protrusion width 62b of the protruding portion 62 and a protrusion height 62c of the protruding portion 62 are appropriately set within a range in which the interior angle of the apex of the triangular shape of the protruding portion 62 on the side where the protruding portion 62 protrudes is larger than 90 degrees. The protrusion width 62b of the protruding portion 62 is a length of the protruding portion 62 in the vertical direction. The protrusion height 62c of the protruding portion 62 is a height of the protruding portion 62 from the side surface 6c of the resin mold 6, and is a length of the protruding portion 62 in the horizontal direction.

Further, the protruding portion 62 according to the first embodiment is formed in the vertical direction from the position of the root of the first lead frame 11 on the upper surface 6a side of the resin mold 6 to the position of the upper end of the side surface 6c of the resin mold 6. However, it suffices that the protruding portion 62 is provided at any position on the side surface 6c of the resin mold 6 in at least a part of a region from the position of the root of the first lead frame 11 on the upper surface 6a side of the resin mold 6 to the upper end of the side surface 6c of the resin mold 6, in the vertical direction. As a result, all the bending angles $\alpha$ of the first lead frame 11 bent from the side surface of the power module 100 along the protruding portion 62 and routed to the upper surface 6a of the resin mold 6 can be made larger than 90 degrees.

Further, the first lead frame 11 bent along the protruding portion 62 does not need to be in close contact with the surface of the protruding portion 62. Even if the first lead frame 11 is apart from the surface of the protruding portion 62, the effect described above can be obtained by providing the protruding portion 62 on the side surface 6c of the resin mold 6.

Figure 8:
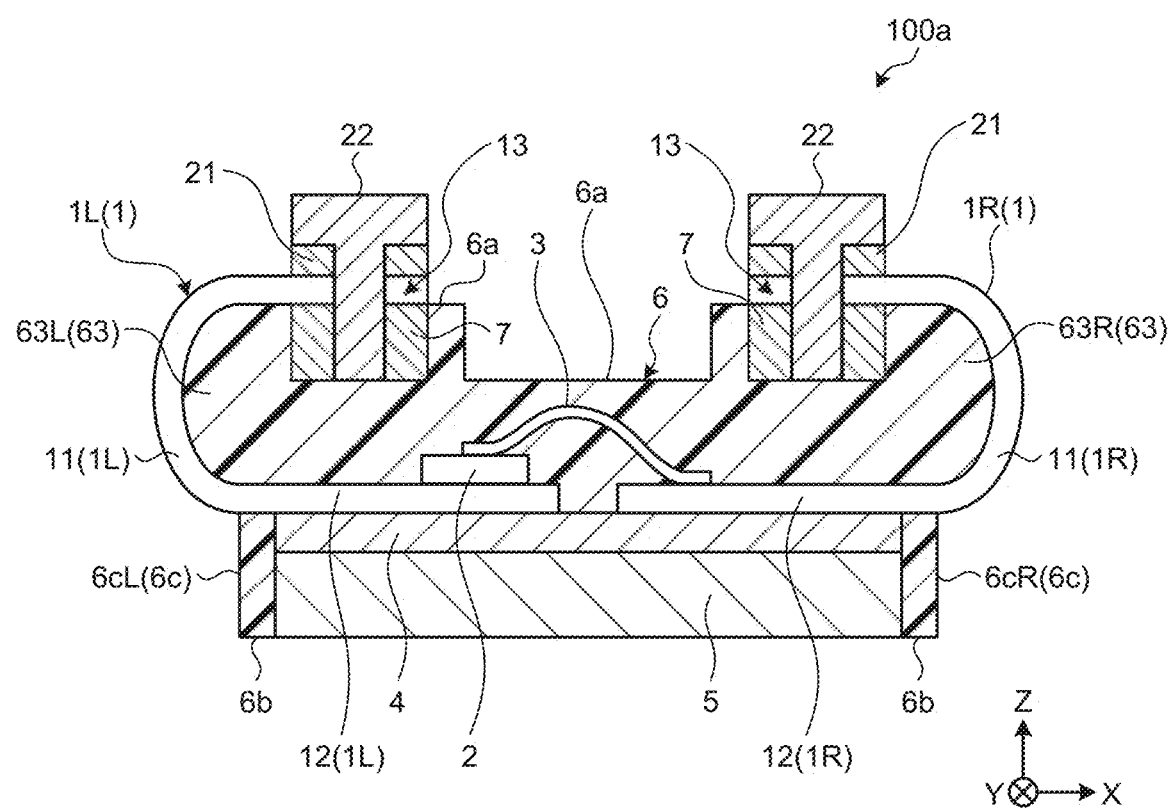
FIG. 8 is a cross-sectional view of another power module according to the first embodiment.
Figure 9:
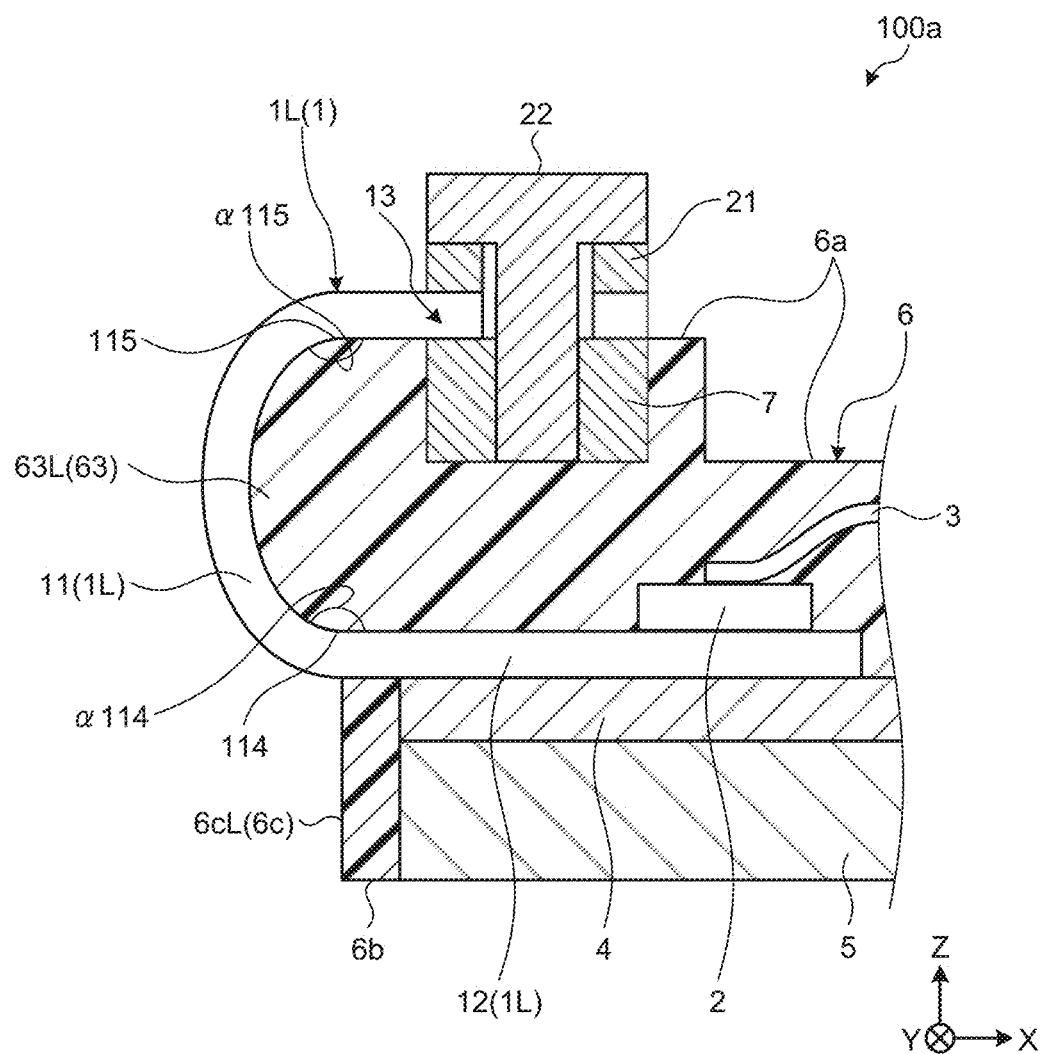
FIG. 9 is an enlarged view of a main part, illustrating a periphery of a protruding portion in FIG. 8 in an enlarged manner.

FIG. 8 is a cross-sectional view of another power module 100a according to the first embodiment. FIG. 9 is an enlarged view of a main part, illustrating a periphery of a protruding portion 63 in FIG. 8 in an enlarged manner. Another power module 100a is different from the power module 100 described above in that the arc-shaped protruding portion 63 is provided protruding laterally from the side surface 6c of the resin mold 6 in front view. The arc-shaped protruding portion 63 is different from the triangular protruding portion 62 in a shape in front view. Similarly to the triangular protruding portion 62, the arc-shaped protruding portion 63 is also formed such that the bending angle $\alpha$ of the lead frame 1 drawn to the outside of the resin mold 6 from the side surface 6c of the resin mold 6 is larger than 90 degrees.

Specifically, a left protruding portion 63L is provided on the left side surface 6cL of the resin mold 6 of another power module 100a. A right protruding portion 63R is provided on the right side surface 6cR of the resin mold 6. The left protruding portion 63L is a protruding portion having an arc shape protruding leftward from the left side surface 6cL of the resin mold 6 in front view. The right protruding portion 63R is a protruding portion having an arc shape protruding rightward from the right side surface 6cR of the resin mold 6 in front view.

In the power module 100a, the first lead frame 11 is bent upward along the protruding portion 63, so that a bending angle $\alpha 114$ of the first lead frame 11 at a bent portion 114 is made larger than 90 degrees. Further, in the power module 100a, a distal end portion of the first lead frame 11 is bent from the protruding portion 63 along a corner of the upper surface 6a, so that a bending angle $\alpha 115$ of the first lead frame 11 at a bent portion 115 is made larger than 90 degrees. Also in another power module 100a having such a configuration, an effect similar to that of the power module 100 described above can be obtained.

Further, the protruding portion 62 according to the first embodiment can be replaced with a protruding portion having a polygonal shape as a shape protruding laterally from the side surface 6c of the resin mold 6 in front view, such as a trapezoidal shape protruding laterally from the side surface 6c of the resin mold 6.

Further, in step S30 described above, the distal end portion of the first lead frame 11 is positioned such that the screw hole 13a of the terminal 13 of the first lead frame 11 overlaps with the screw hole 7a of the nut 7 on the upper surface 6a of the resin mold 60. However, in practice, due to elasticity of the first lead frame 11, a bending state of the first lead frame 11 slightly returns. This causes positional deviation between the screw hole 13a of the terminal 13 of the first lead frame 11 and the screw hole 7a of the nut 7.

Therefore, the screw hole 13a of the terminal 13 of the first lead frame 11 may be formed to have a dimension larger than a diameter dimension of a body portion of the bolt 22 and a diameter dimension of a screw portion of the bolt 22, in order to be able to absorb the positional deviation between the screw hole 13a and the screw hole 7a described above.

As described above, in the power module 100 according to the first embodiment, since the first lead frame 11 is bent along the protruding portion 62, the bending angles α in all the bent portions of the first lead frame 11 are made larger than 90 degrees. Accordingly, in the power module 100, stress applied to resin at a position corresponding to a bent portion when the first lead frame 11 is bent at the bent portion can be reduced as compared with a case where the first lead frame 11 is bent at the bending angle α of 90 degrees or less, and it is possible to suppress an occurrence of cracks in the resin at the portion.

Therefore, the power module 100 according to the first embodiment exhibits an effect of suppressing damage caused by bending of the lead frame 1 drawn out toward a direction perpendicular to the side surface 6c from the side surface 6c which is one surface of the resin mold 6.

Second Embodiment

Figure 10:
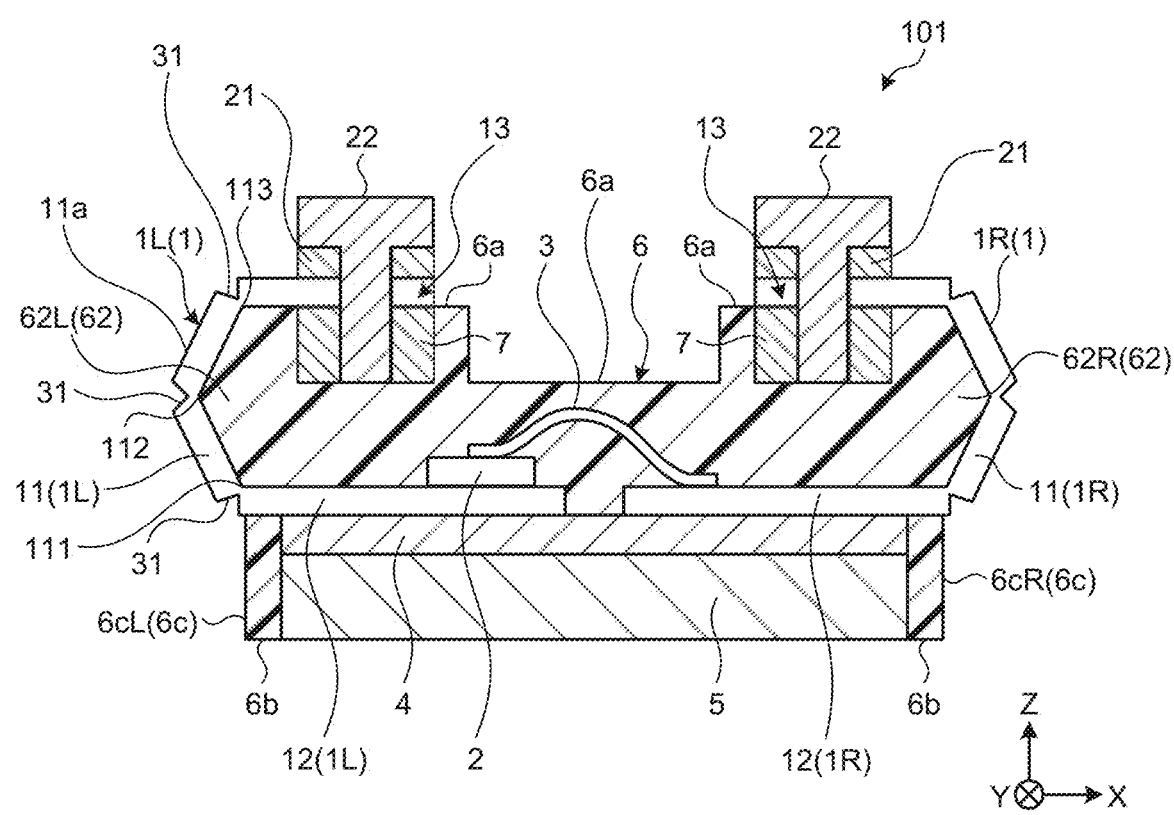
FIG. 10 is a cross-sectional view of a power module according to a second embodiment.

FIG. 10 is a cross-sectional view of a power module 101 according to a second embodiment. The power module 101 according to the second embodiment is different from the power module 100 according to the first embodiment in that a notch 31 is provided at a position corresponding to a bent portion of the first lead frame 11 on an outer surface 11a of the first lead frame 11. That is, the notch 31 is formed at a position where the lead frame 1 is bent, in a region facing the protruding portion 62 in the first lead frame 11. The position where the notch 31 is formed is a position where the first lead frame 11 is bent.

The outer surface 11a is a surface of the first lead frame 11 that is not facing the protruding portion 62, among two surfaces facing each other in a thickness direction of the first lead frame 11. That is, in the first lead frame 11, the outer surface 11a is a surface opposed to a surface facing the protruding portion 62, among two surfaces facing each other in the thickness direction of the first lead frame 11. Further, in the first lead frame 11, the outer surface 11a can be said to be a surface exposed in the power module 101 among two surfaces facing each other in the thickness direction of the first lead frame 11.

The position where the notch 31 is formed in the first lead frame 11 is lower in mechanical strength than a position where the notch 31 is not formed in the first lead frame 11. As a result, in the power module 101, the first lead frame 11 can be bent in step S20 described above with a smaller force than in a case where the notch 31 is not formed, and bending processing of the first lead frame 11 can be easily performed.

Examples of the notch 31 include, for example, a groove formed on the outer surface 11a side along a direction of the width 11W of the first lead frame 11. Note that the groove of the notch 31 may be a groove formed over the entire width of the outer surface 11a in the direction along the width 11W, or may be a groove formed in a part of the outer surface 11a in the direction along the width 11W. Further, a plurality of grooves of the notch 31 may be sporadically formed on the outer surface 11a in the direction along the width 11W.

Further, in the first lead frame 11, the notch 31 may be a perforation formed in the direction along the direction of the width 11W of the first lead frame 11, that is, a plurality of small holes sporadically formed in the direction along the direction of the width 11W and penetrating the first lead frame 11 in the thickness direction.

As illustrated in FIG. 10, on the outer surface 11a of the first lead frame 11, the notch 31 of the power module 101 is formed at a position corresponding to the bent portion 111 of the first lead frame 11, a position corresponding to the bent portion 112 of the first lead frame 11, and a position corresponding to the bent portion 113 of the first lead frame 11.

Figure 11:
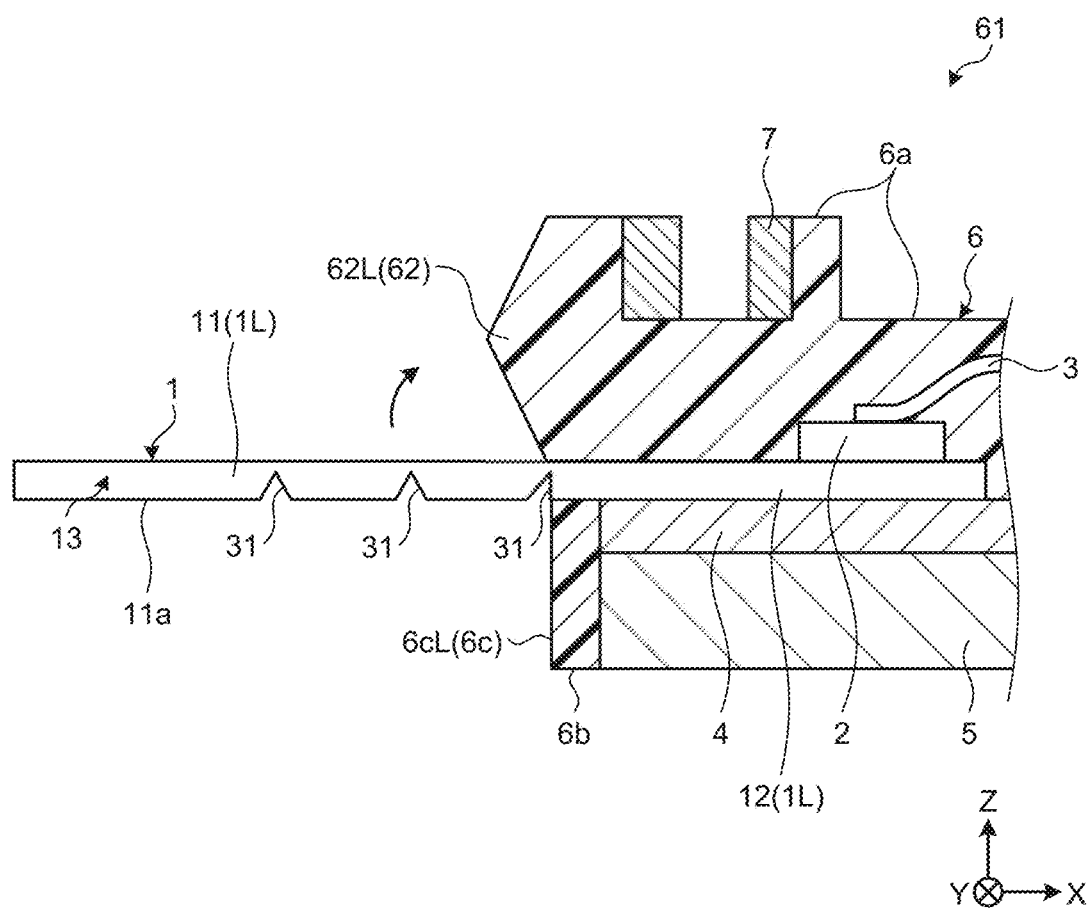
FIG. 11 is a view illustrating a method of manufacturing the power module illustrated in FIG. 10.

FIG. 11 is a view illustrating a method of manufacturing the power module 101 illustrated in FIG. 10. The notches 31 are formed in advance in the lead frame 1 to be used for manufacturing the power module 101. Which part of the first lead frame 11 in the lead frame 1 is to be bent is determined by a shape of the protruding portion 62. In the manufacture of the power module 101, the lead frame 1 in which the notches 31 are formed is used for molding by transfer molding similarly to step S10 described above. As illustrated in FIG. 11, a resin mold 61 molded by transfer molding is in a state where the notches 31 are formed on a lower surface of the lead frame 1, which is to be the outer surface 11a.

Thereafter, in the resin mold 61, a lead frame bending process of bending the lead frame 1 along the protruding portion 62 is performed similarly to step S20 described above. Here, the notch 31 is formed at a position where the first lead frame 11 is bent, and mechanical strength is lower than a case where and the notch 31 is not formed. Therefore, in the resin mold 61, the bending processing of the first lead frame 11 can be performed with a smaller force than in a case where the notch 31 is not formed, and the first lead frame 11 can be easily bent.

As described above, the power module 101 according to the second embodiment has an effect similar to that of the power module 100 according to the first embodiment described above.

Further, in the power module 101, the notches 31 are formed at positions where the first lead frame 11 is bent, and the mechanical strength at the position where the first lead frame 11 is bent is reduced. Therefore, in the power module 101, the first lead frame 11 can be accurately bent with a smaller force than the power module 100. As a result, in the power module 101, stress applied to resin corresponding to a bent portion when the first lead frame 11 is bent at the bent portion can be further reduced, and it is possible to more reliably suppress an occurrence of cracks in the resin at the portion.

Third Embodiment

Figure 12:
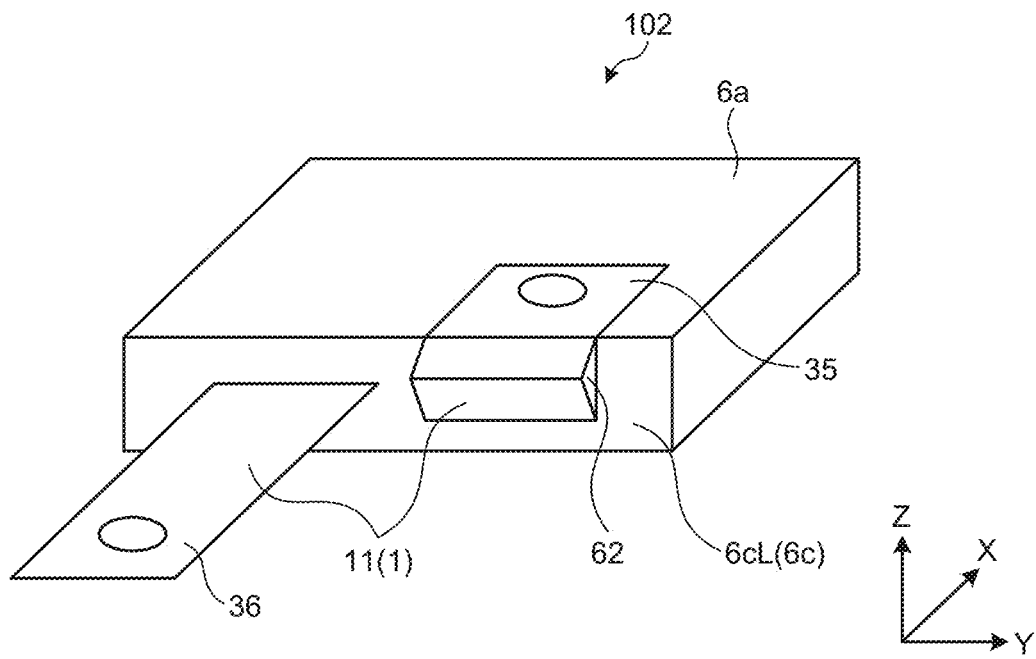
FIG. 12 is a perspective view of a power module according to a third embodiment.

FIG. 12 is a perspective view of a power module 102 according to a third embodiment. Note that components similar to those of the power module 100 according to the first embodiment described above are denoted by reference numerals identical to those of the power module 100.

The power module 102 according to the third embodiment includes a first terminal 35 and a second terminal 36, which are two types of terminals having different positions in a height direction, as terminals to be connected to the external bus bar 21.

Similarly to the terminal 13 of the power module 100 according to the first embodiment, the first terminal 35 is a terminal formed by bending the first lead frame 11 along the protruding portion 62. Therefore, the first terminal 35 is provided on an upper surface of the power module 102, and is provided at a position higher than a height position at which the first lead frame 11 is drawn to the outside from the side surface 6c of the resin mold 6 toward a direction perpendicular to the side surface 6c.

The second terminal 36 is a terminal formed at the distal end portion of the first lead frame 11 in a state of being drawn to the outside from the side surface 6c of the resin mold 6 toward a direction perpendicular to the side surface 6c. Therefore, the second terminal 36 is provided at a height position where the first lead frame 11 is drawn to the outside from the side surface 6c of the resin mold 6.

In the power module 102, the first terminal 35 is provided at a relatively high position with respect to the second terminal 36. Further, in the power module 102, the second terminal 36 is provided at a relatively low position with respect to the first terminal 35. That is, the power module 102 includes: the first terminal 35 provided at the distal end portion of the first lead frame 11 and placed on the upper surface 6a of the resin mold 6; and the second terminal 36 provided at a height position different from that of the first terminal 35.

Figure 13:
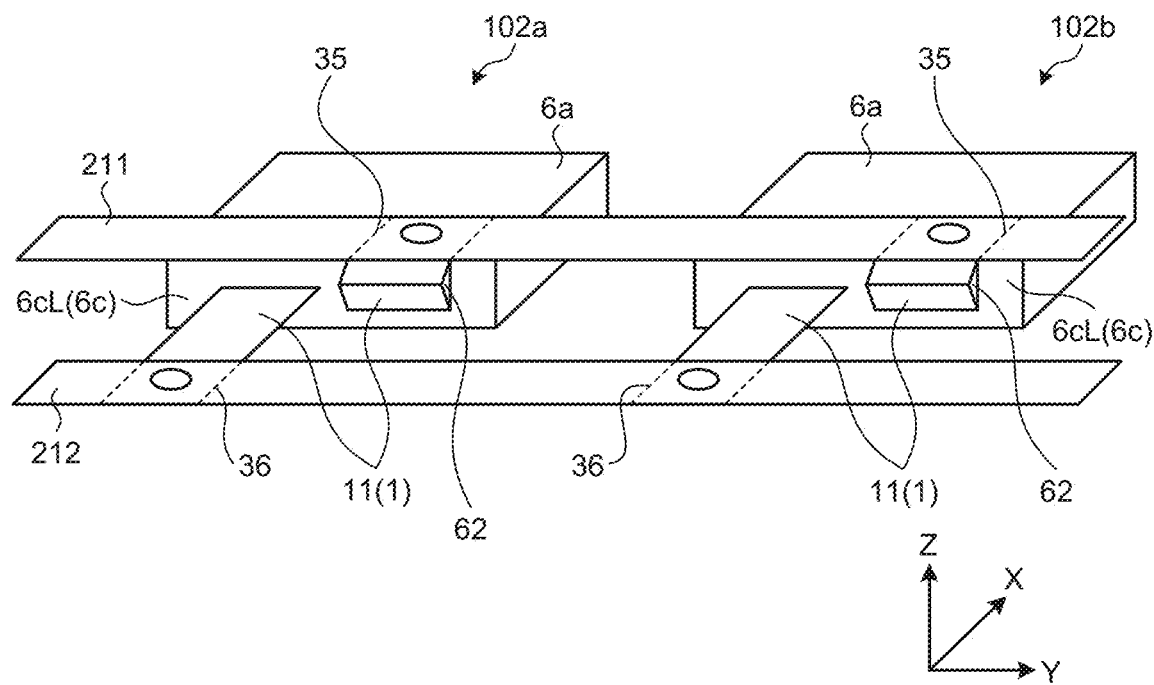
FIG. 13 is a perspective view illustrating a connection structure of two power modules according to the third embodiment.

FIG. 13 is a perspective view illustrating a connection structure of two power modules 102 according to the third embodiment. FIG. 13 illustrates a state in which a first power module 102a which is the power module 102 and a second power module 102b which is the power module 102 are arranged in parallel, and terminals of both are connected by the bus bar 21.

The first terminal 35 of the first power module 102a and the first terminal 35 of the second power module 102b are connected by a first bus bar 211 which is the bus bar 21 having a planar shape. The first terminal 35 of the first power module 102a and the first terminal 35 of the second power module 102b are formed at an equal height position. Therefore, the first bus bar 211 is arranged in parallel with the upper surface 6a of the first power module 102a and the upper surface 6a of the second power module 102b.

The second terminal 36 of the first power module 102a and the second terminal 36 of the second power module 102b are connected by a second bus bar 212 which is the bus bar 21 having a planar shape. The second terminal 36 of the first power module 102a and the second terminal 36 of the second power module 102b are formed at an equal height position. Therefore, the second bus bar 212 is arranged in parallel with the upper surface 6a of the first power module 102a and the upper surface 6a of the second power module 102b. Further, the second bus bar 212 is arranged in parallel with the first bus bar 211.

With the configuration described above, the terminals of the first power module 102a and of the second power module 102b arranged in parallel can be connected in parallel, by using the first bus bar 211 and second bus bar 212 having a planar shape without performing bending processing on both the first bus bar 211 and the second bus bar 212. This facilitates parallel connection between the terminal of the first power module 102a and the terminal of the second power module 102b arranged in parallel. That is, since the power module 102 includes the first terminal 35 and the second terminal 36 having different positions in the height direction, the connection structure by the bus bar 21 between the terminals of the power modules 102 arranged in parallel is simple, and a manufacturing load of the bus bar 21 and a load of connection work of the bus bar 21 are small.

Figure 14:
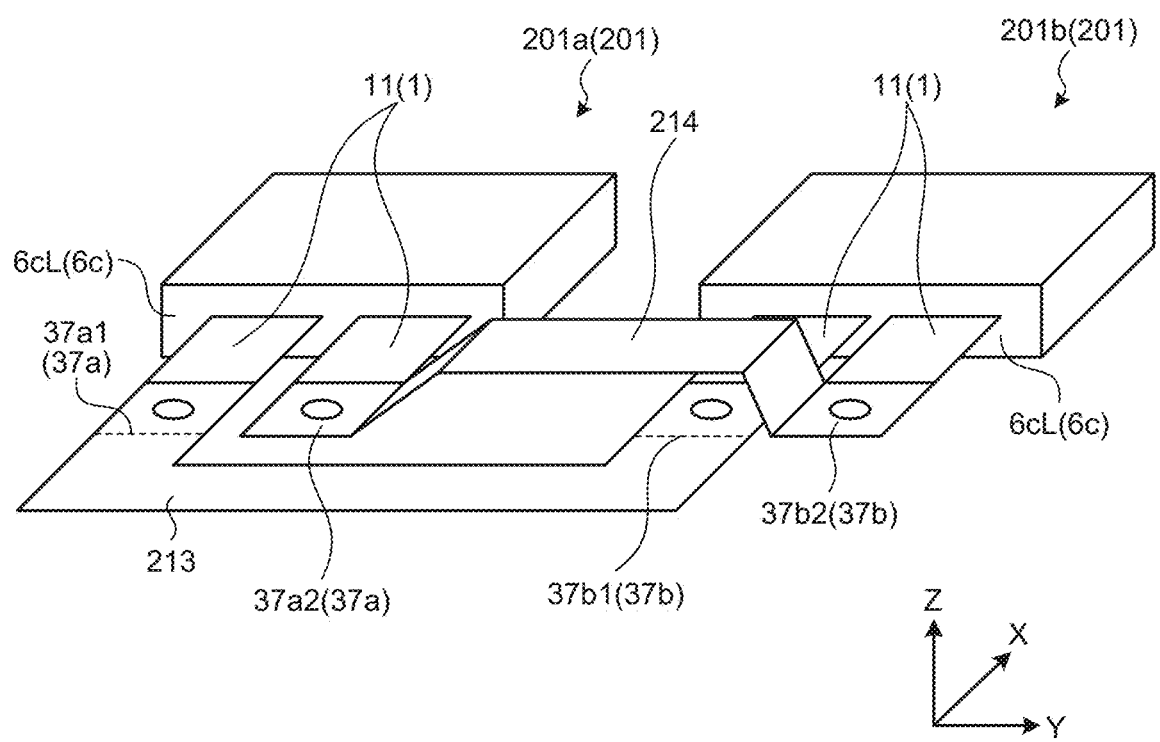
FIG. 14 is a perspective view illustrating a connection structure of a power module according to a comparative example in the third embodiment.

FIG. 14 is a perspective view illustrating a connection structure of a power module 201 according to a comparative example in the third embodiment. FIG. 14 illustrates a state in which a first power module 201a which is the power module 201 according to the comparative example and a second power module 201b which is the power module 201 according to the comparative example are arranged in parallel, and terminals of both are connected by the bus bar 21.

The first power module 201a according to the comparative example includes two terminals 37a, which are one type of terminal having a structure identical to that of the above-described first terminal 35, as terminals to be connected to the external bus bar 21. The second power module 201b according to the comparative example includes two terminals 37b, which are one type of terminal having a structure identical to that of the above-described first terminal 35, as terminals to be connected to the external bus bar 21. Therefore, the two terminals 37a of the first power module 201a according to the comparative example and the two terminals 37b of the second power module 201b according to the comparative example have all the equal positions in the height direction.

A terminal 37a1 which is one of the terminals 37a of the first power module 201a according to the comparative example and a terminal 37b1 which is one of the terminals 37b of the second power module 201b according to the comparative example are connected by a third bus bar 213 which is the bus bar 21 having a U shape. A terminal 37a2 which is another one of the terminals 37a of the first power module 201a according to the comparative example and a terminal 37b2 which is another one of the terminals 37b of the second power module 201b according to the comparative example are connected by a fourth bus bar 214 which is the bus bar 21.

Since positions in the height direction of the two terminals 37a and the two terminals 37b are all equal, the fourth bus bar 214 has a bent shape protruding upward so as to cross over the terminal 37b1 and the third bus bar 213. That is, the fourth bus bar 214 is configured three-dimensionally and has a complicated shape. For this reason, in the structure illustrated in FIG. 14, the connection structure between terminals of the first power module 201a according to the comparative example and the second power module 201b according to the comparative example becomes complicated, and a manufacturing load of the bus bar 21 and a load of the connection work of the bus bar 21 increase.

As described above, according to the power module 102 of the third embodiment, since the first terminal 35 and the second terminal 36 having different positions in the height direction are provided, the connection structure by the bus bar 21 between the terminals of the power modules 102 arranged in parallel is simple. This can reduce a manufacturing load of the bus bar 21 and a load of the connection work of the bus bar 21.

Fourth Embodiment

Figure 15:
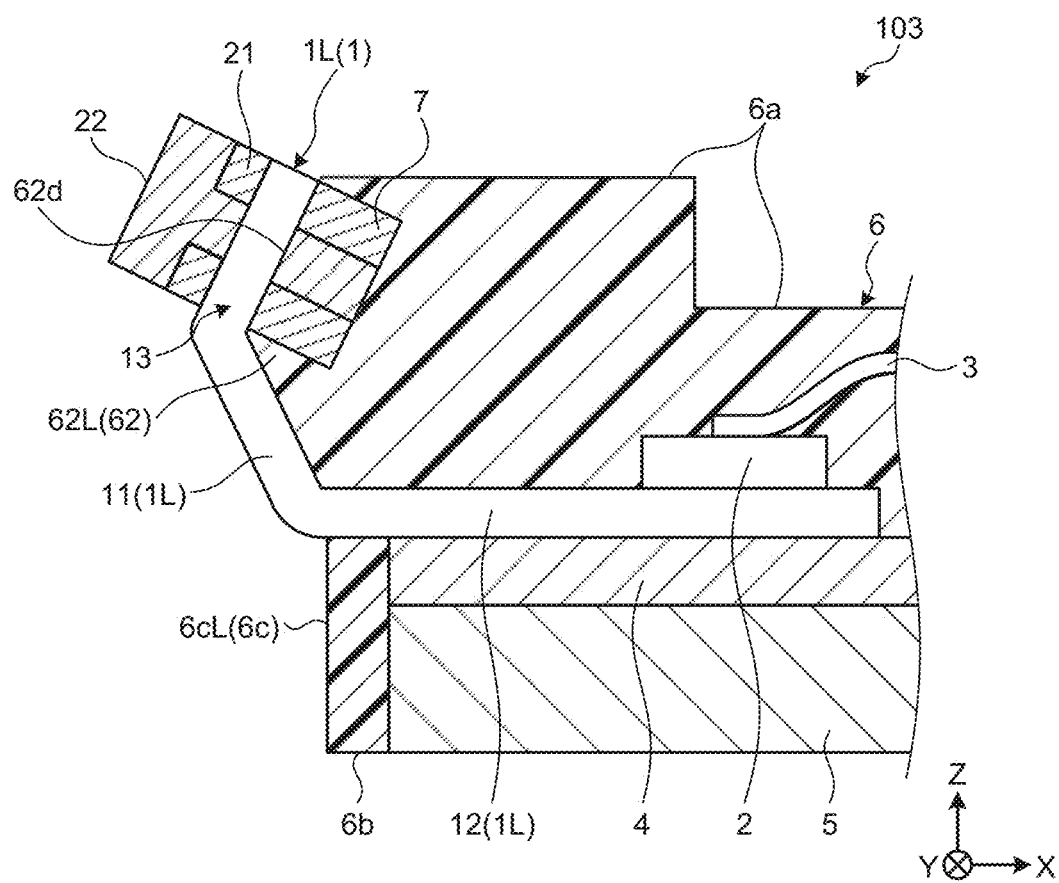
FIG. 15 is an enlarged cross-sectional view of a main part, illustrating a periphery of a left protruding portion of a power module according to a fourth embodiment.
Figure 16:
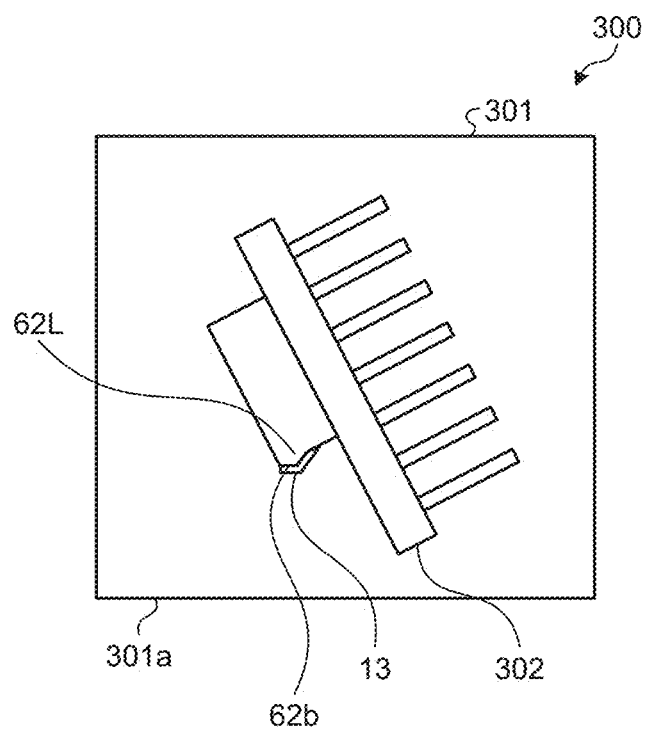
FIG. 16 is a top view of an inverter accommodating the power module according to the fourth embodiment.

FIG. 15 is an enlarged cross-sectional view of a main part, illustrating a periphery of the left protruding portion 62L of a power module 103 according to a fourth embodiment. FIG. 16 is a top view of an inverter 300 accommodating the power module 103 according to the fourth embodiment. Note that components similar to those of the power module 100 according to the first embodiment described above are denoted by reference numerals identical to those of the power module 100.

The power module 103 is different from the power module 100 according to the first embodiment in that the left protruding portion 62L which is the protruding portion 62 is provided only on the left side surface 6cL of the resin mold 6, the first lead frame 11 is drawn out only from the left side surface 6cL of the resin mold 6, and a distal end portion of the first lead frame 11 placed on an inclined surface 62d of the left protruding portion 62L serves as the terminal 13.

In the power module 103, a surface of the terminal 13 is inclined using the left protruding portion 62L, and the bolt 22 is also fastened in an obliquely inclined state. Specifically, the nut 7 is disposed in a surface layer of the upper inclined surface 62d of the left protruding portion 62L. Further, the distal end portion of the first lead frame 11 placed on the upper inclined surface 62d of the left protruding portion 62L serves as the terminal 13. Then, the terminal 13 placed on the upper inclined surface 62d of the left protruding portion 62L is screwed to the upper inclined surface 62d of the left protruding portion 62L, by the bolt 22 being inserted in a direction perpendicular to the upper inclined surface 62d of the left protruding portion 62L. That is, the power module 103 includes the terminal 13 which is a screw terminal provided on the first lead frame 11 bent toward the upper surface of the resin mold 6 along the left protruding portion 62L and placed on the inclined surface 62d of the left protruding portion 62L.

In the power module 103 having such a structure, the distal end portion of the first lead frame 11 placed on the upper inclined surface 62d of the left protruding portion 62L serves as the terminal 13, so that the first lead frame 11 is not routed to the upper surface 6a of the resin mold 6. This makes it possible to shorten a length of the lead frame 1 in the power module 103, and reduce cost of the lead frame 1 and the power module 103.

Figure 17:
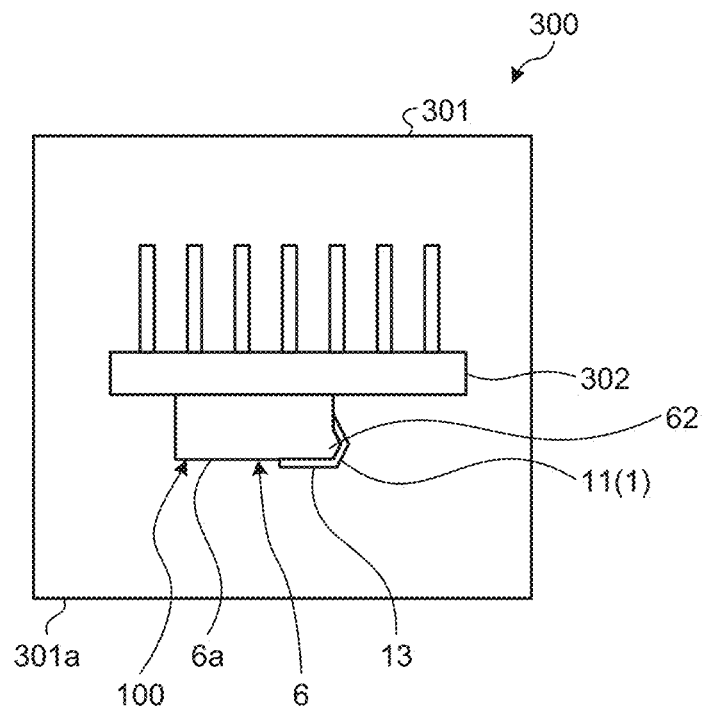
FIG. 17 is a top view of the inverter accommodating the power module according to the first embodiment.
Figure 18:
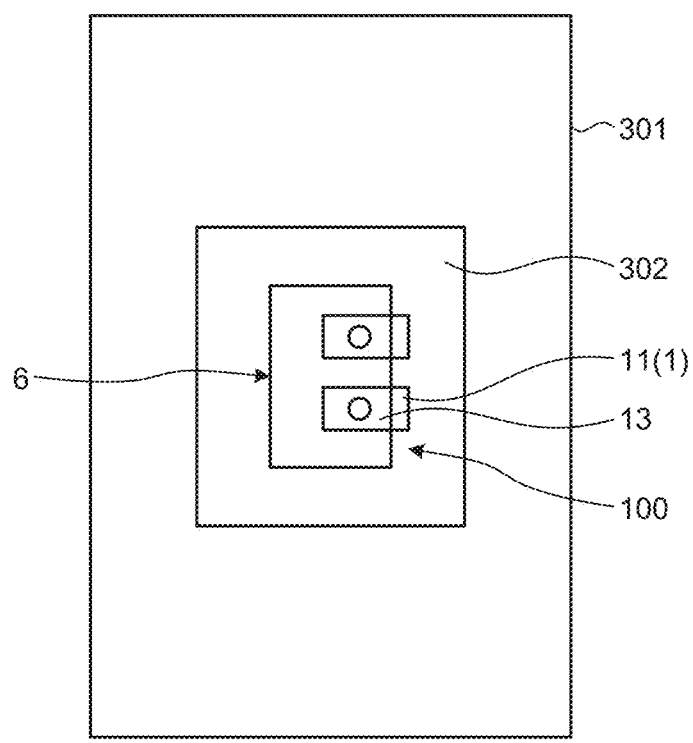
FIG. 18 is a front view of the inverter accommodating the power module according to the first embodiment.

FIG. 17 is a top view of the inverter 300 accommodating the power module 100 according to the first embodiment. FIG. 18 is a front view of the inverter 300 accommodating the power module 100 according to the first embodiment. FIGS. 17 and 18 are illustration focusing arrangement of the power module 100 inside the inverter 300, and other components included in the inverter 300 are omitted.

In the inverter 300, the power module 100 is accommodated inside a housing 301. In the housing 301, a front face 301a of the housing 301 can be opened and closed. In a state where the front face 301a of the housing 301 is opened, an operator performs screwing work on the terminal 13 of the power module 100 from the front face side.

The power module 100 is disposed inside the housing 301 in a state where the upper surface 6a of the resin mold 6, that is, the upper surface of the power module 100 is parallel to the front face 301a of the housing 301. On the rear face side of the power module 100, a heat sink 302 is disposed to improve heat dissipation of heat generated in the power module 100. This allows the operator to perform screwing work on the terminal 13 disposed on the upper surface 6a of the resin mold 6 directly from the front face 301a side of the housing 301, and easily perform screwing work on the terminal 13.

For example, there is a case where it is desired to arrange the power module in a state where the upper surface of the power module is inclined with respect to the front face 301a, due to arrangement of components inside the housing 301 of the inverter 300. In this case, as illustrated in FIG. 16, the power module 103 is disposed inside the housing 301 in a state where the upper inclined surface 62d of the left protruding portion 62L of the power module 103 is parallel to the front face 301a of the housing 301. On the rear face side of the power module 103, the heat sink 302 is disposed to improve heat dissipation of heat generated in the power module 103. In this case, the terminal 13 placed on the upper inclined surface 62d of the left protruding portion 62L of the power module 103 is disposed in a state of facing the front face side.

This allows the operator to perform screwing work on the terminal 13 placed on the upper inclined surface 62d of the left protruding portion 62L directly from the front face 301a side of the housing 301, and easily perform screwing work on the terminal 13. As described above, by using the power module 103 according to the fourth embodiment, it is possible to achieve both improvement in a degree of freedom of arrangement of the power module inside the housing 301 of the inverter 300 and improvement in workability of screwing to the terminal 13.

The configurations illustrated in the above embodiments illustrate one example and can be combined with another known technique, and it is also possible to combine embodiments with each other and omit and change a part of the configuration without departing from the subject matter of the present disclosure.

REFERENCE SIGNS LIST 1 lead frame; 1L left lead frame; 1R right lead frame; 2 power element; 3 metal wire wiring; 4 insulating sheet; 5 metal base; 6, 60, 61 resin mold; 6a upper surface; 6b lower surface; 6c side surface; 6cL left side surface; 6cR right side surface; 7 nut; 7a, 13a, 21a screw hole; 11 first lead frame; 11W width; 11a outer surface; 12 second lead frame; 13, 37a, 37a1, 37a2, 37b, 37b1, 37b2 terminal; 21 bus bar; 22 bolt; 31 notch; 62, 63 protruding portion; 35 first terminal; 36 second terminal; 62a protrusion length; 62b protrusion width; 62c protrusion height; 62d inclined surface; 62L, 63L left protruding portion; 62R, 63R right protruding portion; 100, 100a, 101, 102, 103, 201 power module; 102a, 201a first power module; 102b, 201b second power module; 111, 112, 113, 114, 115 bent portion; α, α111, α112, α113, α114, α115 bending angle; 211 first bus bar; 212 second bus bar; 213 third bus bar; 214 fourth bus bar; 300 inverter; 301 housing; 301a front face; 302 heat sink.

The invention claimed is:
1. A power module comprising:
a resin mold; and
a lead frame in which a first region of the lead frame is drawn out from a first surface of the resin mold, and a second region of the lead frame extending from the first region in a direction perpendicular to the first surface is sealed inside the resin mold, wherein
the first region of the lead frame is bent toward a second surface of the resin mold along the first surface of the resin mold, and
the first surface of the resin mold has a shape in which a bending angle is larger than 90 degrees, the bending angle being an angle formed by two regions of the lead frame, the two regions being adjacent to each other with a bent portion formed by bending the first region interposed in between.

2. The power module according to claim 1, wherein
the first surface includes a protruding portion protruding outward, in at least a part of a region, from a position where the first region is drawn out to an end portion on the second surface side, and
the first region is bent toward the second surface along the protruding portion.

3. The power module according to claim 2, wherein
the first region is provided with a notch at a position corresponding to the bent portion.

4. The power module according to claim 3, wherein
the notch is a groove formed on an outer surface along a width direction of the first region, the outer surface being surface not facing the protruding portion among two surfaces of the first region facing each other in a thickness direction of the first region.

5. The power module according to claim 3, wherein
the notch is a perforation formed along a width direction of the first region.

6. The power module according to claim 2, comprising:
a screw terminal provided in the first region, the first region being bent toward the second surface along the protruding portion and placed on an inclined surface of the protruding portion.

7. The power module according to claim 1, comprising:
a first terminal provided at a distal end portion of the first region and placed on the second surface; and
a second terminal provided at a height position different from a height position of the first terminal.

8. The power module according to claim 7, wherein
the second terminal is provided at a distal end portion of a lead frame drawn out from the first surface in a direction perpendicular to the first surface.

9. A power module comprising:
a resin mold; and
a lead frame, wherein
a first region of the lead frame is drawn out from a first surface of the resin mold, and
a second region of the lead frame is sealed inside the resin mold and extends from the first region of the lead frame in a direction perpendicular to the first surface,
a bent region of the lead frame is formed between the first region of the lead frame and the second region of the lead frame to create a bending angle between an extending direction of the first region of the lead frame and an extending direction of the second region of the lead frame, the bending angle being greater than 90 degrees, and
a surface of the resin mold has a shape matching the bending angle.

10. The power module according to claim 9, wherein
the bending angle is measured on a side of the lead frame closest to the resin mold.

* * * * *